(12) United States Patent
Liu et al.

(10) Patent No.: US 9,288,922 B2
(45) Date of Patent: Mar. 15, 2016

(54) CABLE RETENTION MECHANISM

(71) Applicant: SYMBOL TECHNOLOGIES, INC., Schaumburg, IL (US)

(72) Inventors: Jin Liu, Mississauga (CA); Xiae Zhang, Oakville (CA)

(73) Assignee: Symbol Technologies, LLC, Holtsville, NY (US)

( * ) Notice: Subject to any disclaimer, the term of this patent is extended or adjusted under 35 U.S.C. 154(b) by 92 days.

(21) Appl. No.: 13/973,160

(22) Filed: Aug. 22, 2013

(65) Prior Publication Data

US 2015/0056847 A1 Feb. 26, 2015

(51) Int. Cl.
*H01R 13/58* (2006.01)
*H05K 5/02* (2006.01)
*H01R 107/00* (2006.01)
*H02G 3/08* (2006.01)
*H02G 15/007* (2006.01)

(52) U.S. Cl.
CPC .......... *H05K 5/0247* (2013.01); *H01R 13/5812* (2013.01); *H01R 2107/00* (2013.01); *H01R 2201/16* (2013.01); *H02G 3/083* (2013.01); *H02G 15/007* (2013.01)

(58) Field of Classification Search
CPC ........... H01R 13/5808; H01R 13/5812; H05K 5/0247
USPC ......... 439/449, 470, 790, 357, 358, 459, 460; 174/70 R, 74 R, 168
See application file for complete search history.

(56) References Cited

U.S. PATENT DOCUMENTS

| | | | | |
|---|---|---|---|---|
| 1,983,281 A * | 12/1934 | Fries et al. | ..................... | 439/833 |
| 3,984,801 A * | 10/1976 | Mrenna et al. | ................ | 337/252 |
| 4,017,816 A * | 4/1977 | Latimer, Jr. | ................... | 337/227 |
| 4,108,531 A * | 8/1978 | Reynolds | ....................... | 439/831 |
| 4,127,315 A * | 11/1978 | McKee | ........................ | 439/468 |
| 4,211,463 A * | 7/1980 | Chandler | ..................... | 439/468 |
| 4,306,766 A | 12/1981 | Karol | | |
| 4,963,050 A | 10/1990 | Wendt et al. | | |
| 5,295,850 A * | 3/1994 | Jeffcoat et al. | ................ | 439/266 |
| 5,344,335 A * | 9/1994 | Scholz et al. | ................ | 439/357 |
| 8,979,600 B2 * | 3/2015 | von zur Muehlen et al. | . | 439/833 |

* cited by examiner

*Primary Examiner* — Angel R Estrada
*Assistant Examiner* — Dimary Lopez Cruz

(57) ABSTRACT

A cable retention mechanism locks an external connector with an input/output (I/O) connector of an electronic device. The mechanism includes a retention housing having a first surface and a second surface opposite the first surface, the second surface adjacent to the device housing when the retention mechanism and the electronic device are coupled to one another. The mechanism includes a retainer including a mounting arrangement defining a channel receiving a cable of the external connector, the mounting arrangement biased to apply a first retaining force to the cable. The retainer includes a biasing member compressing a portion of the mounting arrangement such that a width of the channel decreases as the channel approaches the second surface, the biasing member applying a second retaining force to the mounting arrangement to increase the first retaining force. When tension is applied to the cable, the biasing member increases the second retaining force.

9 Claims, 5 Drawing Sheets

CABLE RETENTION MECHANISM

BACKGROUND OF THE INVENTION

An electronic device may be configured to electronically couple to a further electronic device. For example, a desktop computer may be electronically coupled to a monitor. In view of the necessity of the monitor for operation of the applications executed on the desktop computer, ends of a monitor cable include locking screws to provide a semi-permanent coupling between the desktop computer and the monitor cable as well as the monitor and the monitor cable. Therefore, an extreme amount of force may be required to inadvertently remove the end of the monitor cable from a port of the electronic devices. However, an electronic device may also be configured to couple to other electronic devices. For example, a mobile unit may be electronically coupled to the desktop computer for data to be synchronized. However, in view of the mobile unit being utilized in a mobile manner, ends of a connecting cable utilize a relatively weaker coupling such as spring based connectors. When an inadvertent force is applied to the connecting cable, the mobile unit may be inadvertently decoupled from the desktop computer. That is, the electronic device may no longer be coupled to the further electronic device.

There are a variety of reasons in which secured locking features are not utilized on the connecting ends of a connecting cable. In particular, when relating to connecting a mobile unit to an electronic device or when relating to a temporary connection, locking features are conventionally not provided on the ends of the connecting cable. For example, in a vehicle mounted computer, external devices may be electronically coupled thereto using various different input/output connectors (e.g., USB, audio jack, Ethernet, etc.). Again, with no locking features, the ends of the cable may easily be pulled out of the ports which is disruptive and substantially reduces productivity. A separate physical component may be used to retain the ends of the cable in the electronic devices to maintain the electronic coupling. However, these components conventionally are difficult to install, difficult to remove, and not easy for service (e.g., tie wraps). Other components only provide a compressive force laterally along the cable that is received in the component usually relying solely on friction such that any other inadvertent force still results in the cable being disconnected.

Accordingly, there is a need for a cable retention mechanism that prevents ends of a cable that electronically couples two electronic devices from being removed from ports of the devices by any inadvertent force that would cause the end of the cable from being removed from the ports.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
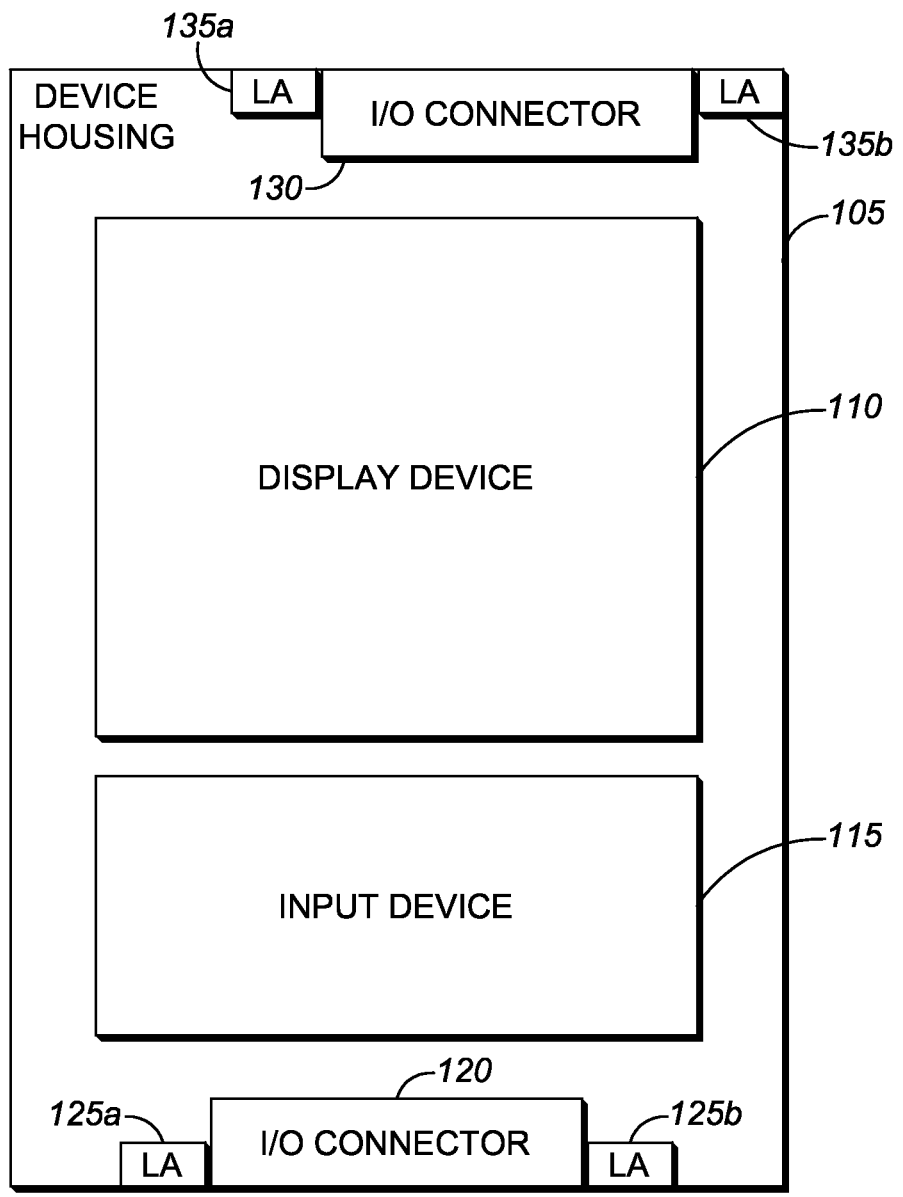
FIG. 1 shows an electronic device that utilizes a retention mechanism in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

The exemplary embodiments provide a cable retention mechanism. The cable retention mechanism is for locking an external connector with an input/output (I/O) connector of an electronic device. The mechanism comprises a retention housing configured to couple to the electronic device, the retention housing having a first surface and a second surface opposite the first surface, the second surface being adjacent to the device housing when the retention mechanism and the electronic device are coupled to one another; and a retainer disposed at least partially within the retention housing and including: a mounting arrangement defining a channel configured to receive a cable of the external connector, the mounting arrangement being biased to apply a first retaining force to the cable; and a biasing member coupled to the mounting arrangement, the biasing member compressing a portion of the mounting arrangement adjacent to the channel such that a width of the channel decreases as the channel approaches the second surface, the biasing member applying a second retaining force to the mounting arrangement to increase the first retaining force, wherein, when tension is applied to the cable, the biasing member increases the second retaining force.

The exemplary embodiments may be further understood with reference to the following description and the appended drawings, wherein like elements are referred to with the same reference numerals. The exemplary embodiments describe a cable retention mechanism that couples to an electronic device. The cable retention mechanism includes at least one retainer that receives a cable in which an end of the cable is received in an input/output (I/O) connector of the electronic device. The retainer includes a spring wire that is configured to apply a force on the cable to prevent the end of the cable from being removed from the I/O connector. The spring wire is further configured to apply an increased force on the cable when the cable is subject to a pulling force that would otherwise remove the end of the cable from the I/O connector. The cable retention mechanism, the electronic device, the retainer, the cable, the ends thereof, the I/O connector, and the spring wire will be discussed in further detail below.

FIG. 1 shows an electronic device 100 that utilizes a retention mechanism in accordance with some embodiments. The electronic device 100 may be any electronic device configured to be electronically coupled to a further electronic device. For example, the electronic device 100 may be a desktop computer, a laptop, a cellular phone, a smartphone, a personal digital assistant, a tablet, an imager (e.g., a barcode scanner), etc. The electronic device 100 may include a housing 105, a display device 110, an input device 115, a first I/O connector 120, a first locking arrangement 125a, 125b, a second I/O connector 130, and a second locking arrangement 135a, 135b. FIG. 1 illustrates an exterior view of the electronic device 100 with a constructive view of the I/O connectors and the locking arrangements that are partially disposed within the housing 105 but exposed to an exterior of the housing 105.

It should be noted that the electronic device 100 may include further conventional components. For example, the electronic device 100 may include a processor, a memory arrangement, a transceiver, a portable power supply, an audio output component, audio input component, etc. These components may provide conventional functionalities for the electronic device 100. The display device 110 and the input device 115 may also provide conventional functionalities for the electronic device 100. For example, the display device 110 may show data to a user while the input device 115 may enable the user to provide inputs. The display device 110 may also be a touch enabled component in which inputs may be provided on a surface thereof such that the input device 115 is incorporated in the display device 110.

The I/O connectors 120, 130 may be any component configured to receive an end of a cable such that an electronic connection may be established between the electronic device 100 and a further electronic device. For example, the I/O connectors 120, 130 may be ports that receive a respective jack of the cable. The I/O connectors 120, 130 may utilize any shape and size that corresponds to the shape and size of the end of the cable. For example, if the I/O connector 120 is an audio port, the I/O connector 120 may be a substantially cylindrical recess as the audio jack has a substantially cylindrical shape. In another example, if the I/O connector 130 is a data port such as a USB port, the I/O connector 130 may be a substantially rectangular recess as the USB jack has a substantially rectangular shape. The I/O connectors 120, 130 may include internal wiring or connections to further components of the electronic device 100 such as the processor, the audio output component, etc.

The locking arrangements 125a, 125b, 135a, 135b may be any component configured to couple to corresponding locking arrangements of the retention mechanism. As will be described in further detail below, the locking arrangements 125a, 125b, 135a, 135b semi-permanently couple the retention mechanism to the housing 105 such that an inadvertent force applied to the retention mechanism is incapable of decoupling the retention mechanism from the housing 105.

It should be noted that the electronic device 100 may be configured with any number of I/O connectors and that the use of the I/O connector 120 and the I/O connector 130 is only exemplary. For example, only a single I/O connector may be included with the electronic device 100. In another example, three or more I/O connectors may be included with the electronic device 100. However, as the retention mechanism of the exemplary embodiments are used as a manner of retaining an end of a cable within the I/O connector, at least one I/O connector is included with the electronic device 100. The I/O connectors 120, 130 being disposed at bottom and top surfaces of the housing 105, respectively, are only exemplary as well. The I/O connectors of the electronic device 100 may be disposed on any of the surfaces of the housing 105. It should also be noted that the I/O connectors 120, 130 being described as a recess (female) that receives the end of the cable (male) is only exemplary. The I/O connectors 120, 130 may also be extensions (male) extending from the housing 105 while the ends of the cable include recesses (female). That is, an opposite configuration may also be utilized. The housing 105 may include further features such that this configuration provides a substantially similar flush feature with regards to the housing. For example, the I/O connectors 120, 130 (as extensions) may be received within the housing 105 when not in use and released from the housing 105 (extending from housing 105) when required.

It should further be noted that the locking arrangements 125a, 125b, 135a, 135b having multiple components surrounding the I/O connectors 120, 130, respectively, is only exemplary. As illustrated and as will be described in further detail below, the locking arrangements 125a, 125b, 135a, 135b may be threaded recesses that receive a screw from the corresponding locking arrangement of the retention mechanism. Accordingly, a first threaded recess may be disposed on a first side of the I/O connector while a second threaded recess may be disposed on a second side of the I/O connector (e.g., to provide stabilization). However, any type of locking arrangement may be utilized. For example, clips, hook and loop fasteners, magnets, etc. that provide a sufficient enough coupling between the electronic device 100 and the retention mechanism may be used. It should also be noted that the disposition of the locking arrangements 125a, 125b, 135a, 135b on opposing ends of the I/O connectors 120, 130, respectively, is only exemplary. The locking arrangements 125a, 125b, 135a, 135b may be disposed on any portion of the housing so long as the retention mechanism is properly oriented to provide its functionality with respect to the I/O connectors 120, 130.

Figure 2:
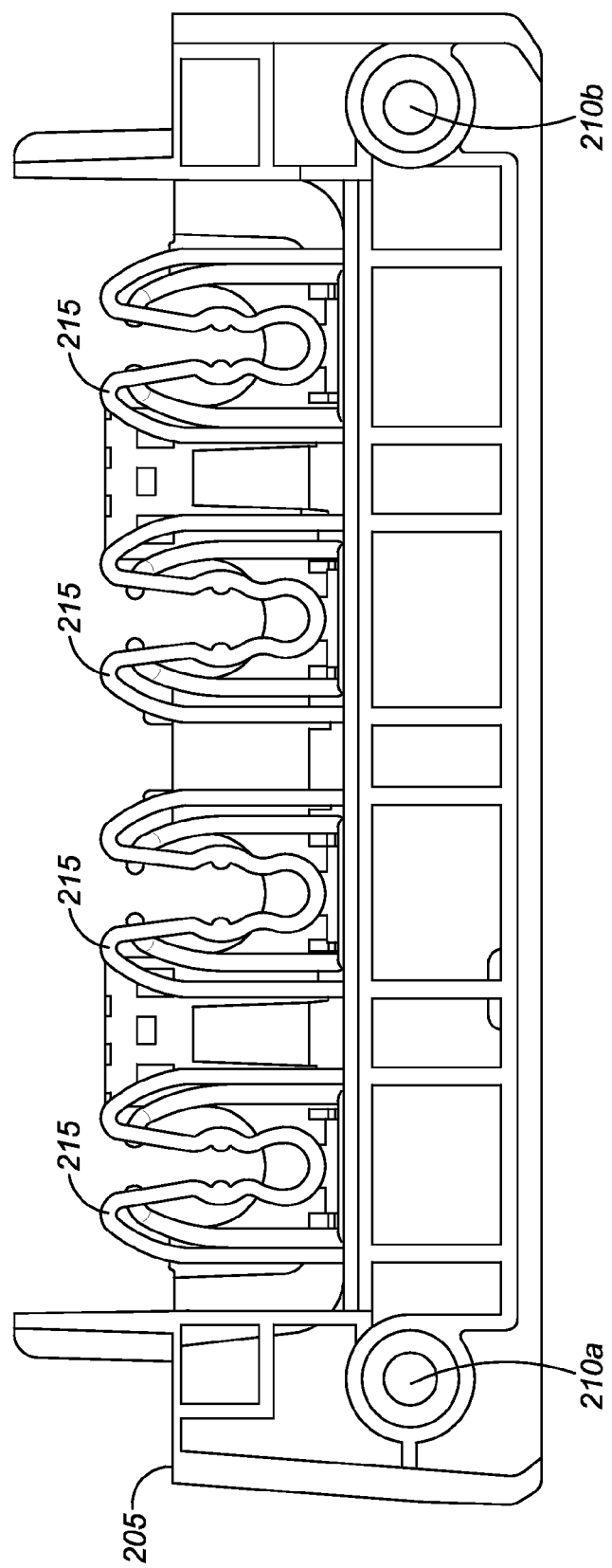
FIG. 2 shows a side view of the retention mechanism used with the electronic device of FIG. 1 in accordance with some embodiments.
Figure 3:
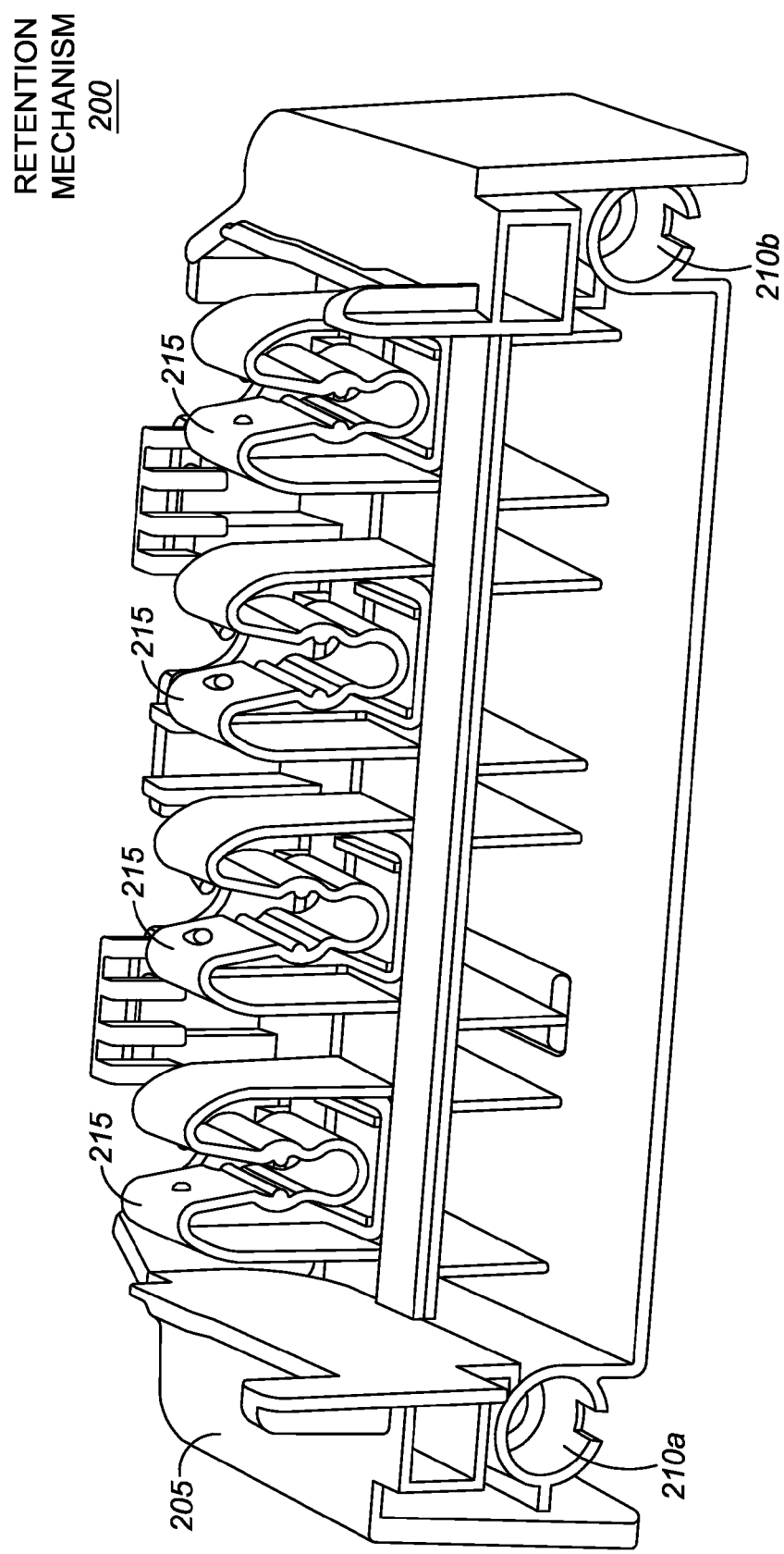
FIG. 3 shows a perspective view of the retention mechanism used with the electronic device of FIG. 1 in accordance with some embodiments.

FIG. 2 shows a side view of the retention mechanism 200 used with the electronic device 100 of FIG. 1 in accordance with some embodiments. FIG. 3 shows a perspective view of the retention mechanism 200 used with the electronic device 100 of FIG. 1 in accordance with some embodiments. The retention mechanism 200 enables a cable to be held such that a force applied to the cable prevents an end of the cable that is received in the I/O connectors 120, 130 from being removed. The retention mechanism 200 includes a housing 205, a locking arrangement 210a, 210b, and a plurality of retainers 215.

The housing 205 of the retention mechanism 200 may include a molding such that the locking arrangement 210 and the retainers 215 may be at least partially disposed on the housing 205. The locking arrangement 210a, 210b may be the corresponding component to the locking arrangements 125a, 125b, 135a, 135b of the electronic device 100. For example, when the locking arrangements 125a, 125b, 135a, 135b of the electronic device 100 are threaded recesses, the locking arrangement 210a, 210b of the retention mechanism 200 may include a screw. As illustrated in FIGS. 2 and 3, the locking arrangement 210a, 210b may also be a threaded recess that receives a separate screw that may be threadedly engaged with the recess of the locking arrangement 210a, 210b and also with the recess of the locking arrangements 125a, 125b, 135a, 135b. That is, the screw may be threaded through the locking arrangement 210a, 210b and subsequently the locking arrangements 125a, 125b, 135a, 135b. Since the locking arrangement 210a, 210b of the retention mechanism is designed to be utilized in conjunction with the locking arrangements 125a, 125b, 135a, 135b of the electronic device 100, the locking arrangement 210a, 210b may be spaced accordingly. For example, if the locking arrangements 125a, 125b, 135a, 135b are shown to scale, the locking arrangement 125a, 125b is spaced further apart than the locking arrangement 135a, 135b. Therefore, a retention mechanism 200 that couples to the electronic device 100 for the I/O connector 120 may thus include a locking arrangement 210a, 210b that corresponds to the spacing distance of the locking arrangement 125a, 125b. The same applies to a retention mechanism 200 that couples to the electronic device 100 for the I/O connector 130.

It should again be noted that the locking arrangement 210a, 210b being a screw or recess that receives a separate screw is only exemplary and that any coupling arrangement may be used. For example, the housing 205 of the retention mechanism 200 may include a casing component such as bumpers extending from the housing 205 shown in FIGS. 2 and 3. The casing component may conform to the housing 105 of the electronic device 100 such that the electronic device 100 is firmly held therewithin, thereby coupling the retention mechanism 200 to the electronic device 100. In such an embodiment, it should be noted that the locking arrangement 210a, 210b of the retention mechanism 200 and the locking arrangements 125a, 125b, 135a, 135b of the electronic device 100 may be unnecessary. It should also be noted that the disposition of the locking arrangement 210a, 210b on ends of the housing 205 is only exemplary and that the locking arrangement 210a, 210b may be disposed anywhere on the housing 205 that corresponds to the locking arrangements 125a, 125b, 135a, 135b of the electronic device 100.

The retainers 215 are the component of the retention mechanism 200 that receives the cable and prevents forces to be applied on the cable that would remove the end of the cable from the I/O connectors 120, 130 of the electronic device 100. As shown, the retention mechanism 200 may include four retainers 215 such that four different cables may be received therein concurrently. Accordingly, the I/O connectors 120, 130 may also be configured to receive at least four different cable ends. It should be noted that the use of four retainers 215 is only exemplary and the retention mechanism 200 may include any number of retainers 215. However, at least one retainer 215 is included in the retention mechanism 200.

Figure 4A:
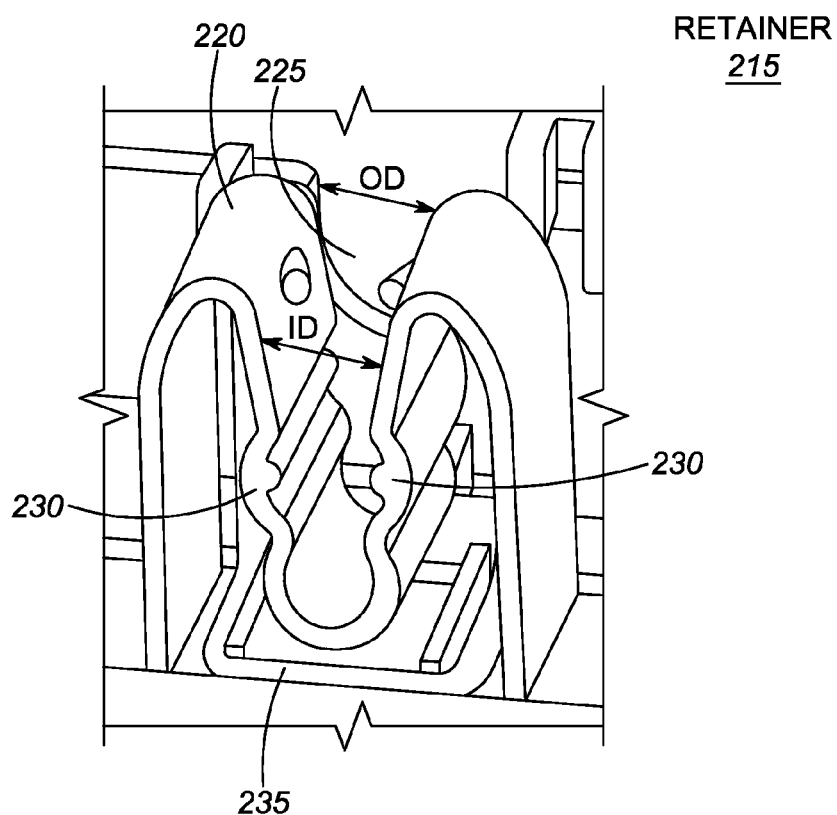
FIG. 4A shows a retainer of the retention mechanism in accordance with some embodiments.

FIG. 4A shows the retainer 215 of the retention mechanism 200 in accordance with some embodiments. The retainer 215 is configured to receive a cable therein such that it is held to prevent a force that is applied to the cable from removing the cable end from the I/O connectors 120, 130. The retainer 215 includes a mounting 220, a channel 225, gripping features 230, and a spring wire 235.

The mounting 220 includes the channel 225 that receives the cable. As illustrated in FIG. 4A, when viewed from a side, the mounting 220 is a substantially M-shaped component. The outer legs of the mounting 220 may be permanently coupled to the housing 205. The inner legs of the mounting 220 may be shaped to create the channel 225. Accordingly, towards a top side of the mounting 220 (opposite side of the permanent coupling to the housing 205), the channel 225 opens to an exterior. The cable may be received from this opening of the channel 225 and moved downward. As the inner legs of the mounting 220 converge from the opening toward the opposite end, the cable pushes the inner legs apart from each other. The materials used by the mounting 220 may be sufficiently elastic such that the cable may be moved in this manner. Furthermore, the inner legs of the mounting 220 provide a clamping force on the cable. Specifically, the inner legs provide a lateral force on the cable to retain the cable in the channel 230. In addition, the cable may be moved in this direction toward the gripping features 230. The gripping features 230 are disposed on the inner legs of the mounting 220 substantially across an entire length thereof parallel (or coaxial) to the channel 225. The gripping features 230 are configured to provide an additional frictional force to be applied to retain the cable in the channel 225. For example, the gripping features 230 may be rounded extensions (as illustrated in FIG. 4A). In another example, the gripping features 230 may be ribs, a roughened surface, etc. The forces applied by the mounting 220 and the gripping features 230 may provide sufficient retention on the cable such that a predetermined maximum amount of force applied on the cable in a longitudinal or lateral direction relative to the cable does not remove the end of the cable from being removed from the I/O connectors 120, 130.

It should be noted that the channel 225 may be sized to accommodate a plurality of different sized cables. In a first exemplary embodiment and as illustrated in FIG. 4A, the channel 225 may include an increased area portion near the gripping features 230 for the cable to received in a predetermined position. The increased area portion may correspond to the diameter of the cable that is to be received. In order to further accommodate other cables having different sizes, the further retainers 215 of the retention mechanism 200 as shown in FIGS. 2 and 3 may have different respectively sized increased area portions for these other cables. In a second exemplary embodiment, the channel 225 may be configured to increase in size to accommodate cables having increased diameters. Initially, the channel 225 may be sized to be the same size of a minimum diameter cable. The gripping features 230 may be relied upon to retain the cable in the channel 225. Furthermore, the material used for the mounting 220 may be sufficiently elastic for the channel 225 to be increased in size to accommodate other cables having a greater diameter. Thus, a single channel 225 may accommodate different cables having different sized.

Figure 4B:
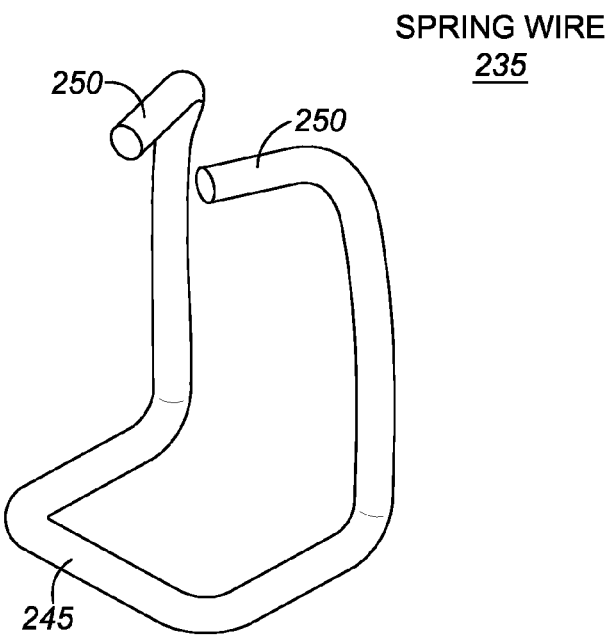
FIG. 4B shows a spring wire of the retainer in accordance with some embodiments.

In addition to the mounting 220 and the gripping features 230, the retainer 215 may include the spring wire 235. FIG. 4B shows the spring wire 235 of the retainer 215 in accordance with some embodiments. The spring wire 235 may be a biasing member. The spring wire 235 may include a loop portion 245 and ends 250. Specifically, as illustrated in FIG. 4B, the spring wire 235 may be substantially U-shaped when viewed from a first side and may be substantially C-shaped when viewed from a second side. The spring wire 235 may be sized such that it is disposed beneath the M-shaped mounting 220. Specifically, the spring wire 235 may be positioned relative to the mounting 220 such that the ends 250 engage an interior side of the inner legs of the mounting 220.

Initially, the spring wire 235 may further provide a biasing force to the inner legs of the mounting 220 such that the predetermined maximum amount of force that would remove the cable ends from the I/O connectors 120, 130 may be increased. Specifically, a further lateral force may be added to each inner leg of the mounting 220 by the spring wire 235. Accordingly, the spring wire 235 may be made of a sufficiently elastic material to provide this feature. Therefore, as the cable is received in the channel, the inner legs of the mounting 220 may separate. The rounded extensions of the gripping features 230 may further cause the inner legs of the mounting 220 to separate as the cable is received in this portion of the inner legs of the mounting 220. Since the spring wire 235 is biased such that the ends 250 converge toward each other, the spring wire 235 may provide this additional biasing force on the inner legs of the mounting 220 such that the predetermined maximum amount of force is increased.

Furthermore, as illustrated in FIG. 4B, the spring wire 235 is shaped such that the ends 250 are predisposed to be angled toward each other on a top side. The mounting 220 may also be shaped to accommodate this shape of the spring wire 235.

The angling of the ends 250 may cause the mounting 220 to have a substantial V-shape when viewed from a top side of the retainer 215. That is, the top sides of the mounting 220 (where the outer legs and the inner legs are coupled) are not parallel but instead are angled to converge toward each other. An initial orientation of the top sides of the mounting 220 may be, for example, parallel to one another. By introduction of the spring wire 235 in its desired position and orientation relative to the mounting 220, the top sides of the mounting 220 may have the substantial V-shape in which the channel 225 decreases in width along the length of the mounting 220. FIG. 4A illustrates an outer distance (OD) between opposing inner legs and an inner distance (ID) between opposing inner legs of the mounting 220. The OD is the side near the exterior of the retention mechanism 200 (side remaining exposed after coupling to the electronic device 100) while the ID is the side near the interior of the retention mechanism 200 (side coupled to the housing 105 of the electronic device 100). When at rest with no cable received in the channel 225, the OD may be greater than the ID. That is, the spring wire 235 causes the inner legs of the mounting 220 to converge towards each other from the greater OD to the lesser ID.

It should be noted that the V-shape of the mounting 220 may cause an asymmetric force to be applied across the length of the mounting 220. Specifically, a greater "pinching" force may be applied to the cable received in the channel 225 near the ID with a lesser force being applied on the cable near the OD. However, the gripping features 230 and/or the material used to manufacture the mounting 220 may be configured such that a constant retaining force is applied to the cable across the length of the mounting 220. For example, the gripping features 230 may be rounded extensions in which the gripping features 230 extend a first, lesser distance near the ID while extending a second, greater distance near the OD. Accordingly, the distance between the gripping features 230 may be constant along the length of the mounting 220 to apply the constant gripping force.

Figure 5:
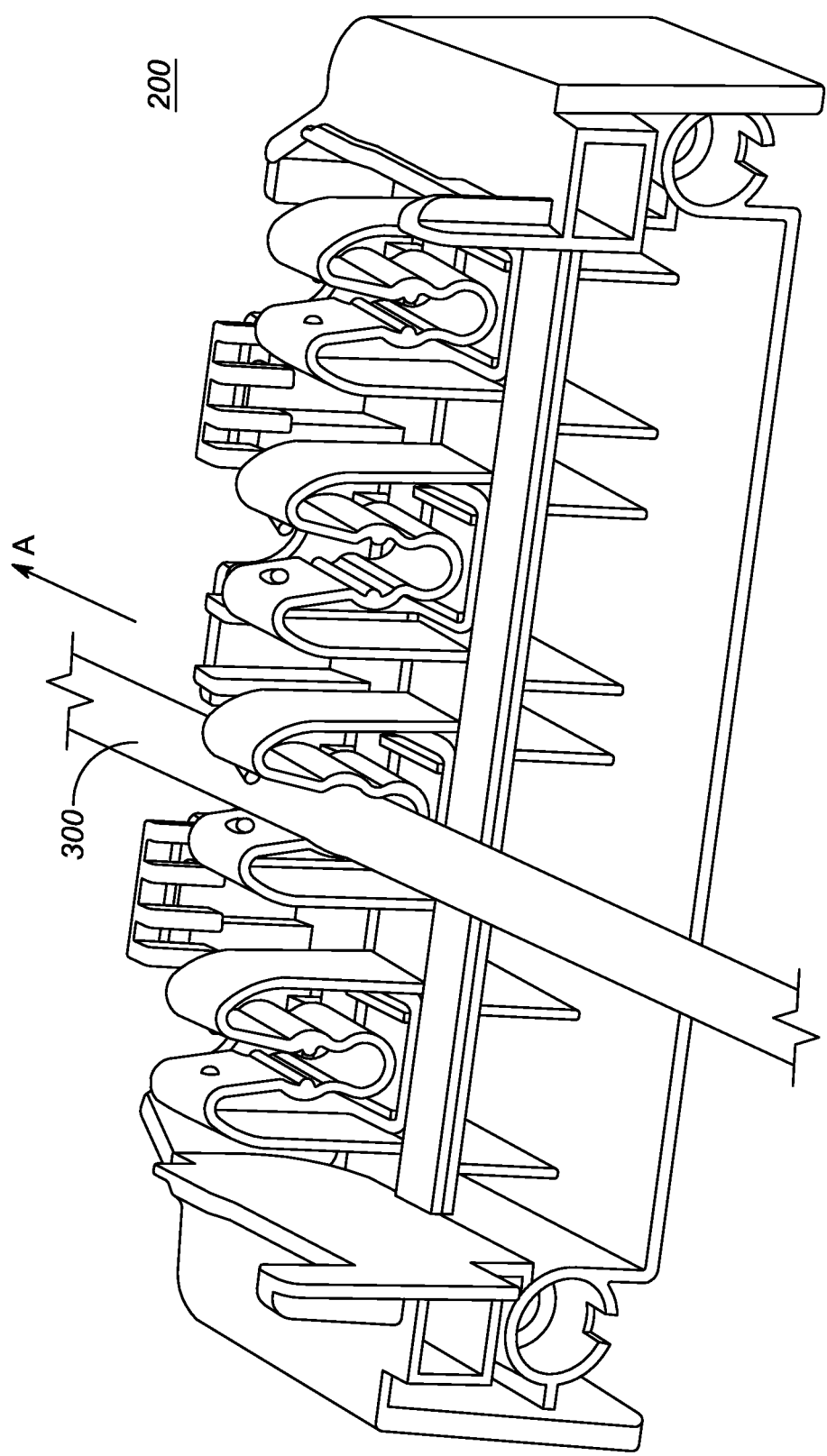
FIG. 5 shows the retention mechanism with a cable received in the retainer in accordance with some embodiments.

The spring wire 235 and the V-shape of the mounting 220 may provide an additional feature for retaining the cable in the channel 225. Specifically, when a force is applied on the cable in a direction from the ID toward the OD, the spring wire 235 (via its shape, size, and orientation) and the V-shape of the mounting 220 may cause the inner legs of the mounting 220 to further converge (particularly near the ID), thereby creating a greater lateral force to be applied on the cable. FIG. 5 shows the retention mechanism 200 with a cable 300 received in the retainer 215 in accordance with some embodiments. When a force is applied on the cable in the direction A, the spring wire 235 and the V-shape of the mounting 220 cause the inner legs of the mounting 220 to converge further. In this manner, an additional lateral force is applied on the cable 330 such that an even greater predetermined amount of force for removal is required.

Those skilled in the art will understand that there are many circumstances in which inadvertent forces are applied to cables that would cause the cable end to be removed from the I/O connector. The retention mechanism 200 provides a first lateral force to be applied on the cable 300 by the mounting 220 via the spring bias of the material of the mounting 220. The retention mechanism 200 provides a second lateral force to be applied on the cable 300 by the gripping features 230 via the increased frictional force. The retention mechanism 200 provides a third lateral force to be applied on the cable 300 by the mounting 220 from the spring wire 235. When the force in the direction A is applied, the retention mechanism provides an increased third lateral force to be applied on the cable 300 by the mounting 220 converging further. Accordingly, when the force in the direction A is not applied, the first, second, and third lateral forces are used to retain the cable 300 in the channel 225 of the retainer 215. When the force in the direction A is applied, the first, second, and increased third lateral forces are used to retain the cable 300 in the channel 225 of the retainer 215.

For purposes of ultimately removing the cable 300 from the retainer 215, a user may manually apply a force that is greater than the predetermined amount of force created from the first, second, and third lateral forces. As no force is applied in the direction A for removal, the user is not required to consider the fourth lateral force. Once the cable has been removed from the retainer 215, the user may manually remove the end of the cable 300 from the I/O connectors 120, 130.

The exemplary embodiments provide a cable retention mechanism that couples to an electronic device. The coupling may be provided using any locking arrangement that is included with both the retention mechanism and the electronic device or with a casing that is included with the retention mechanism. The electronic device may include an I/O connector that couples to an end of a cable. To prevent this end from being decoupled from the I/O connector, the retention mechanism is configured to receive the cable in a retainer. The retainer provides a predetermined amount of lateral force to be applied on the cable such that any lesser force (particularly in a direction that decouples the cable end and the I/O connector) is insufficient to decouple the cable from the I/O connector. Furthermore, when a force is applied in a direction that decouples the cable end and the I/O connector, the retention mechanism provides an additional lateral force to increase the predetermined amount of lateral force applied on the cable to further ensure that the cable end is not decoupled from the I/O connector.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A cable retention mechanism for locking an external connector with an input/output connector of an electronic device, comprising:
    a retention housing configured to couple to the electronic device, the retention housing having a first surface and a second surface opposite the first surface, the second surface being adjacent to the device housing when the retention mechanism and the electronic device are coupled to one another; and
    a retainer disposed at least partially within the retention housing and including:
        a mounting arrangement defining a channel configured to receive a cable of the external connector, the mounting arrangement being biased to apply a first retaining force to the cable; and
        a biasing member coupled to the mounting arrangement, the biasing member compressing a portion of the mounting arrangement adjacent to the channel such that a width of the channel decreases as the channel approaches the second surface, the biasing member applying a second retaining force to the mounting arrangement to increase the first retaining force, the biasing member having ends angled towards each other in a converging V-shape to apply an asymmetric force across a length of the mounting arrangement,
        wherein, when a longitudinal tension is applied to the cable, the biasing member increases the second retaining force.

2. The cable retention mechanism of claim 1, wherein the biasing member is a spring wire that is U-shaped when viewed from a first side and C-shaped when viewed from a second side.

3. The cable retention mechanism of claim 2, wherein the first portion is disposed at least partially in the retention housing, the first portion configured to engage a second portion of the locking arrangement that is disposed at least partially in the device housing of the electronic device.

4. The cable retention mechanism of claim 1, wherein the mounting arrangement includes gripping features configured to increase the first retaining force.

5. The cable retention mechanism of claim 4, wherein the gripping features are rounded extensions extending into the channel.

6. The cable retention mechanism of claim 1, wherein the biasing member has a substantial U-shape corresponding to a substantial M-shape of the mounting arrangement.

7. The cable retention mechanism of claim 6, wherein the mounting arrangement has a shape configured to engage the biasing member, the substantial U-shape of the biasing member including a loop portion and end portions extending from the loop portion.

8. The cable retention mechanism of claim 7, wherein the end portions of the biasing member converge toward each other such that the channel is caused to converge.

9. The cable retention mechanism of claim 1, wherein the second retaining force is increased from the channel being caused to converge further.

\* \* \* \* \*